United States Patent
Lin et al.

(10) Patent No.: US 11,935,611 B2
(45) Date of Patent: Mar. 19, 2024

(54) MEMORY DEVICE, MEMORY TEST CIRCUIT AND MEMORY TEST METHOD THEREOF HAVING REPAIR INFORMATION MAINTAINING MECHANISM

(71) Applicant: REALTEK SEMICONDUCTOR CORPORATION, Hsinchu (TW)

(72) Inventors: Sheng-Lin Lin, Hsinchu (TW); Shih-Chieh Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 170 days.

(21) Appl. No.: 17/718,356

(22) Filed: Apr. 12, 2022

(65) Prior Publication Data
US 2023/0031828 A1  Feb. 2, 2023

(30) Foreign Application Priority Data
Jul. 28, 2021 (TW) .................. 110127774

(51) Int. Cl.
*G11C 7/00* (2006.01)
*G11C 29/32* (2006.01)
*G11C 29/44* (2006.01)

(52) U.S. Cl.
CPC .......... *G11C 29/4401* (2013.01); *G11C 29/32* (2013.01); *G11C 2029/3202* (2013.01)

(58) Field of Classification Search
CPC ................................... G11C 29/4401
USPC ...................................... 365/200
See application file for complete search history.

(56) References Cited

U.S. PATENT DOCUMENTS

2006/0039211 A1* 2/2006 Rearick ................ G11C 29/848
365/200

OTHER PUBLICATIONS

V. R. Devanathan and S. Vooka, "Techniques to improve memory interface test quality for complex SoCs," in Proc. International Test Conference, 2011, pp. 1-10.
Kelly A. Ockunzzi, Michael R. Ouellette and Kevin W. Gorman, "Optimizing Delay Tests at the Memory Boundary", 2015, pp. 1-9, IEEE.

* cited by examiner

*Primary Examiner* — Hoai V Ho
(74) *Attorney, Agent, or Firm* — WPAT, PC

(57) ABSTRACT

The present invention discloses a memory test circuit having repair information maintaining mechanism. A repairing control circuit controls a MBISR circuit to perform a self-repair procedure on a memory circuit and includes a remapping storage circuit and a latch storage circuit. The remapping storage circuit receives and stores repairing information generated by the MBISR circuit after the self-repair procedure finishes. The latch storage circuit is electrically coupled between the remapping storage circuit and a remapping circuit corresponding to the memory circuit to receive and store the repairing information from the remapping storage circuit such that the remapping circuit accesses the repairing information therefrom when a scan test is performed on the remapping storage circuit based on a scan chain to perform remapping and repairing on the memory circuit based on the repairing information and a redundant structure of the memory circuit.

10 Claims, 2 Drawing Sheets

MEMORY DEVICE, MEMORY TEST CIRCUIT AND MEMORY TEST METHOD THEREOF HAVING REPAIR INFORMATION MAINTAINING MECHANISM

BACKGROUND OF THE INVENTION

1. Field of the Invention

The present invention relates to a memory device, a memory test circuit and a memory test method thereof having repair information maintaining mechanism.

2. Description of Related Art

When the circuit chips are finished being manufactured, a plurality tests are performed to make sure the chips operate correctly. For example, a scan test performed based on a scan chain can find out the chips with defects, in which these chips may include logic circuits having stuck-at fault and a delay fault. The disposition of a memory built-in self-test circuit can be used to find out the chips having a memory with detects. Read/write operations within a plurality of clock periods can be performed on the memory by feeding automatic test pattern generation (ATPG) test data through the scan chain to test whether a delay fault occurs on a path between a functional register to the memory.

However, in the scan test, shift registers in the scan chain may have data loss due to the shifting operation. If some registers store the data used to repair the memory, the memory cannot be accurately repaired such that a fault is generated in the test results.

SUMMARY OF THE INVENTION

In consideration of the problem of the prior art, an object of the present invention is to supply a memory device, a memory test circuit and a memory test method thereof having repair information maintaining mechanism.

The present invention discloses a memory test circuit having repair information maintaining mechanism that includes a memory built-in self repair (MBISR) circuit and a repairing control circuit. The repairing control circuit is configured to control the memory built-in self repair circuit to perform a built-in self-repair procedure on a memory circuit having a redundant structure. The repairing control circuit includes a remapping storage circuit and a latch storage circuit. The remapping storage circuit is disposed in a scan chain and configured to receive and store repairing information generated by the memory built-in self repair circuit after the built-in self-repair procedure is finished. The latch storage circuit is electrically coupled between the remapping storage circuit and a remapping circuit corresponding to the memory circuit, and is configured to receive and store the repairing information from the remapping storage circuit, such that the remapping circuit accesses the repairing information when the remapping storage circuit performs a scan test based on the scan chain to perform remapping and repairing on the memory circuit based on the repairing information and the redundant structure.

The present invention also discloses a memory device that includes a memory circuit and a memory test circuit. The memory circuit has a redundant structure. The memory test circuit includes a memory built-in self repair circuit and a repairing control circuit. The repairing control circuit is configured to control the memory built-in self repair circuit to perform a built-in self-repair procedure on the memory circuit having a redundant structure. The repairing control circuit includes a remapping storage circuit and a latch storage circuit. The remapping storage circuit is disposed in a scan chain and configured to receive and store repairing information generated by the memory built-in self repair circuit after the built-in self-repair procedure is finished. The latch storage circuit is electrically coupled between the remapping storage circuit and a remapping circuit corresponding to the memory circuit, and is configured to receive and store the repairing information from the remapping storage circuit, such that the remapping circuit accesses the repairing information when the remapping storage circuit performs a scan test based on the scan chain to perform remapping and repairing on the memory circuit based on the repairing information and the redundant structure.

The present invention further discloses a memory test method having a repair information maintaining mechanism that includes the steps outlined below. A memory built-in self repair circuit is controlled to perform a built-in self-repair procedure on a memory circuit having a redundant structure by a repairing control circuit. Repairing information generated by the memory built-in self repair circuit is received and stored by a remapping storage circuit of the repairing control circuit after the built-in self-repair procedure is finished, wherein the remapping storage circuit is disposed in a scan chain. The repairing information is received and stored from the remapping storage circuit by a latch storage circuit of the repairing control circuit, wherein the latch storage circuit is electrically coupled between the remapping storage circuit and a remapping circuit corresponding to the memory circuit. The repairing information is accessed by a remapping circuit of the memory circuit under the control of the latch storage circuit when the remapping storage circuit performs a scan test based on the scan chain to perform remapping and repairing on the memory circuit based on the repairing information and the redundant structure.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory device, a memory test circuit and a memory test method thereof having repair information maintaining mechanism to accurately store repairing information such that the memory circuit performs repairing accordingly. The condition that false test results are obtained due to the loss of repairing information in the scan test such that the memory circuit is unable to perform repairing in some approaches can be obtained.

Figure 1:
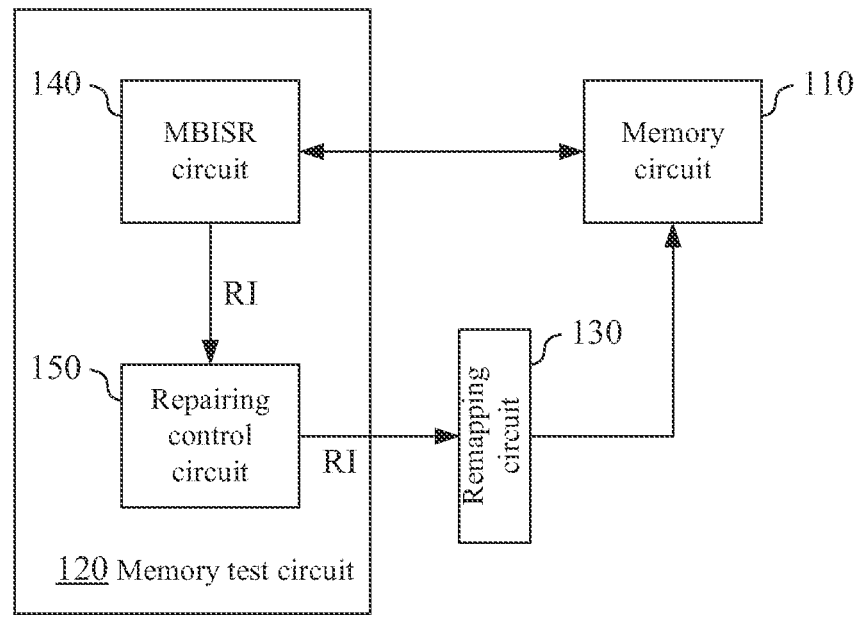
FIG. 1 illustrates a block diagram of a memory device according to an embodiment of the present invention.

Reference is now made to FIG. 1. FIG. 1 illustrates a block diagram of a memory device 100 according to an embodiment of the present invention. The memory device 100 includes a memory circuit 110 and a memory test circuit 120.

In an embodiment, the memory circuit 110 has a redundant structure. In different embodiments, such a redundant structure can be at least one redundant column, at least one redundant row or at least one redundant input/output terminal.

For example, the memory circuit 110 can be a static random access memory (SRAM) having 8192×64 memory units and having a redundant input/output terminal structure. As a result, the memory circuit 110 actually has 8192×65 memory units. It is appreciated that the structures and the values described above is merely an example. The present invention is not limited thereto.

The memory test circuit 120 is configured to perform built-in self test and analysis on the memory circuit 110 to feed test data therein and read test results, so as to generate repairing information RI. In an embodiment, corresponding to the memory circuit 110, the memory device 100 includes a remapping circuit 130 configured to receive the repairing information RI to perform remapping on the memory circuit 110 so as to perform repairing on the memory circuit 110. More specifically, the remapping circuit 130 determines the bits on certain locations of the memory circuit 110 having defects and required to be replaced by the bits of the redundant structure according to the repairing information RI.

It is appreciated that in FIG. 1, the remapping circuit 130 is illustrated to be independent from the memory circuit 110. In practical implementation, the remapping circuit 130 can be disposed in the memory circuit 110 and becomes a part of the memory circuit 110.

As a result, when the data in the memory circuit 110 includes faults due to the bits having defects, the data repairing can be performed based on the repairing information RI and the redundant structure.

The memory test circuit 120 includes a memory built-in self repair (MBISR) circuit 140 and a repairing control circuit 150.

The memory built-in self repair circuit 140 includes such as, but not limited to a built-in self test circuit and a built-in self analysis circuit (not illustrated in the figure). The repairing control circuit 150 is configured to control the memory built-in self repair circuit 140 to feed the test data to the memory circuit 110 to perform a built-in self-repair procedure that includes the built-in self test and analysis.

Figure 2:
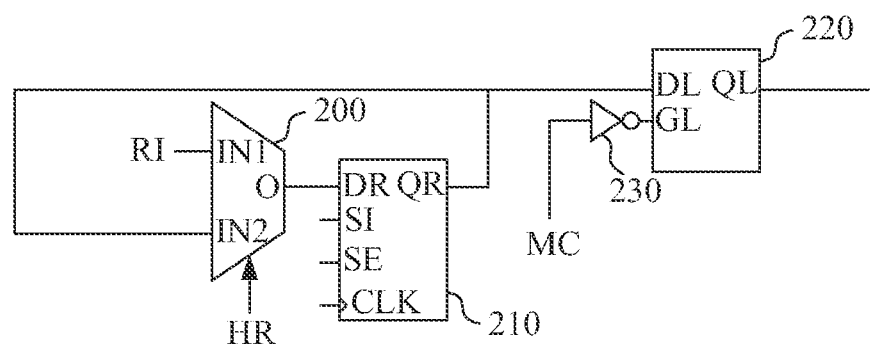
FIG. 2 illustrates a circuit diagram of a part of the components included in the repairing control circuit according to an embodiment of the present invention.

Reference is now made to FIG. 2 at the same time. FIG. 2 illustrates a circuit diagram of a part of the components included in the repairing control circuit 150 according to an embodiment of the present invention.

In an embodiment, the repairing control circuit 150 includes a multiplexer 200, a remapping storage circuit 210 and a latch storage circuit 220.

The multiplexer 200 has a first input terminal IN1, a second input terminal IN2 and an output terminal O. The first input terminal IN1 is electrically coupled to the memory built-in self repair circuit 140 in FIG. 1. The second input terminal IN2 and the output terminal O are electrically coupled to the remapping storage circuit 210.

In an embodiment, the multiplexer 200 is configured to receive a selection signal HR to switch the select input terminal. The selection signal HR can be generated by such as, but not limited to a control circuit (not illustrated in the figure) included in the memory built-in self repair circuit 140 according to the mode required to be executed by the remapping storage circuit 210. For example, when the selection signal HR is at a first state, the multiplexer 200 operates in a receiving mode and selects the first input terminal IN1 as the input terminal to receive the information transmitted by the memory built-in self repair circuit 140. When the selection signal HR is at a second state, the multiplexer 200 operates in a latch mode and selects the second input terminal IN2 as the input terminal to receive the information stored in the remapping storage circuit 210, such that the information stored in the remapping storage circuit 210 is maintained based on the loop formed by the remapping storage circuit 210 and the multiplexer 200.

The remapping storage circuit 210 is configured to receive and store the repairing information RI generated by the memory built-in self repair circuit 140 after the built-in self-repair procedure is finished.

More specifically, after the built-in self-repair procedure is finished, the multiplexer 200 operates in the receiving mode according to the selection signal HR having the first state to select the first input terminal IN1 as the input terminal, so as to receive the repairing information RI generated by the memory built-in self repair circuit 140 and transmit the repairing information RI through the output terminal O to be stored in the remapping storage circuit 210.

In an embodiment, the remapping storage circuit 210 includes a storage input terminal DR and a storage output terminal QR. The storge input terminal DR is electrically coupled to the output terminal O of the multiplexer 200 to receive the repairing information RI. The storage output terminal QR is electrically coupled to both the second input terminal IN2 of the multiplexer 200 and the latch storage circuit 220, so as to output the repairing information RI. It is appreciated that the remapping storage circuit 210 may include more terminals, e.g., the input terminals CLK, SI and SE to receive a clock signal, a serial input signal and a scan test signal, so as to execute the corresponding functions.

Besides being disposed in the repairing control circuit 150, the remapping storage circuit 210 is also located in a scan chain (not illustrated in the figure) of an electronic system related to the memory device 100. The scan chain includes a plurality of shift registers coupled in series. When a read/write operation is performed on the memory circuit 110 of the electronic system so as to execute a scan test, the remapping storage circuit 210 operates together with the other shift register circuits in the scan chain to shift the test data fed in the scan chain to accomplish the object of scan test.

The latch storage circuit 220 is electrically coupled between the storage output terminal QR of the remapping storage circuit 210 and the remapping circuit 130 in FIG. 1, and configured to receive and store the repairing information RI from the remapping storage circuit 210. When the remapping storage circuit 210 performs the scan test based on the scan chain, the remapping circuit 130 accesses the repairing information RI to perform remapping and repairing on the memory circuit 110 based on the repairing information RI and the redundant structure.

In an embodiment, the latch storage circuit 220 includes a latch input terminal DL, a latch output terminal QL and a control terminal GL. The latch input terminal DL is electrically coupled to the storage output terminal QR of the remapping storage circuit 210. The latch output terminal QL is electrically coupled to the remapping circuit 130 in FIG. 1. The control terminal GL is configured to receive a mode control signal MC. The mode control signal MC can be a signal related to the scan test described above. The memory test circuit 120 mainly operates in a non-scan test mode and switches to the scan test mode after the memory test circuit 120 receives the repairing information RI. In general, the scan test and the memory test can be performed independently. As a result, the mode control signal MC can be transmitted from such as, but not limited to a register or a pad outside of the memory test circuit 120, so as to control the mode required to be executed by the remapping storage circuit 210.

In an embodiment, based on the mode control signal MC, the latch storage circuit 220 is configured to operate in a transparent mode before the built-in self-repair procedure is finished to become a bypass state. Further, the latch storage circuit 220 is configured to operate in a storage mode after the built-in self-repair procedure is finished, in which the latch storage circuit 220 receives and stores the repairing information RI from the remapping storage circuit 210.

In an embodiment, the latch storage circuit 220 receives the mode control signal MC through an inverter 230 such that the latch storage circuit 220 operates in the transparent mode when the mode control signal MC is at the first state and operates in the storage mode when the mode control signal MC is at the second state.

After the repairing information RI is stored, the latch storage circuit 220 is configured to allow the remapping circuit 130 in FIG. 1 accessing the repairing information RI to perform remapping and repairing on the memory circuit 110 when the remapping storage circuit 210 receives automatic test pattern generation (ATPG) data from such as, but not limited to the input terminal SE to perform the scan test based on the scan chain.

In some approaches, when the electronic system that the memory device 100 locates performs the scan test that is related to such as, but not limited to delay fault, the content stored in the remapping storage circuit 210 is shifted to the other shift register circuits in the scan chain since the remapping storage circuit 210 is disposed in the scan chain. The repairing information RI is not able to be kept in the remapping storage circuit 210. Under such a condition, the memory circuit 110 cannot perform repairing according to the repairing information RI such that the bits having defects in the scan test results are read under the unrepaired state. The bits having defects results in false test results.

The memory device 100 of the present invention uses the memory test circuit 120 to perform built-in self-test and analysis on the memory circuit 110 to generate the repairing information RI such that the remapping storage circuit 210 receives and transmits the repairing information RI to the latch storage circuit 220 to store the repairing information RI. The scan test can be kept being performed on the remapping storage circuit 210 in the scan chain, in which the latch storage circuit 220 provides the repairing information RI to the memory circuit 110 to perform repairing. The accurate test result of the scan test related to the memory circuit 110 can thus be obtained.

Figure 3:
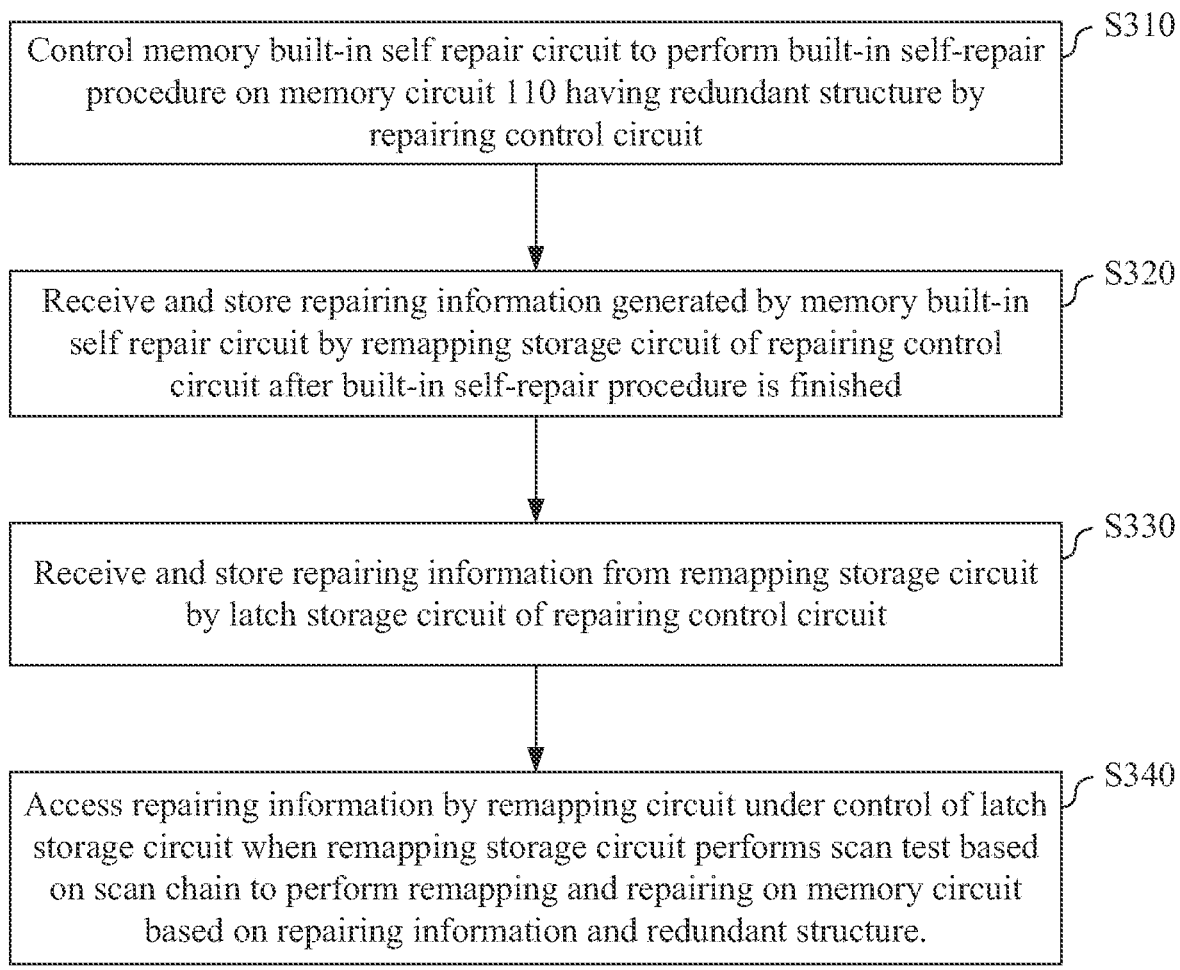
FIG. 3 illustrates a flow chart of a memory test method having repair information maintaining mechanism according to an embodiment of the present invention.

Reference is now made to FIG. 3. FIG. 3 illustrates a flow chart of a memory test method 300 having repair information maintaining mechanism according to an embodiment of the present invention.

In addition to the apparatus described above, the present disclosure further provides the memory test method 300 that can be used in such as, but not limited to, the memory test circuit 120 in FIG. 1. As illustrated in FIG. 3, an embodiment of the memory test method 300 includes the following steps.

In step S310, the memory built-in self repair circuit 140 is controlled to perform the built-in self-repair procedure on the memory circuit 110 having the redundant structure by the repairing control circuit 150.

In step S320, the repairing information RI generated by the memory built-in self repair circuit 140 is received and stored by the remapping storage circuit 210 of the repairing control circuit 150 after the built-in self-repair procedure is finished, wherein the remapping storage circuit 210 is disposed in the scan chain.

In step S330, the repairing information RI is received and stored from the remapping storage circuit 210 by the latch storage circuit 220 of the repairing control circuit 150.

In step S340, the repairing information RI is accessed by the remapping circuit 130 under the control of the latch storage circuit 220 when the remapping storage circuit 210 performs the scan test based on the scan chain to perform remapping and repairing on the memory circuit 110 based on the repairing information RI and the redundant structure.

It is appreciated that the embodiments described above are merely an example In other embodiments, it should be appreciated that many modifications and changes may be made by those of ordinary skill in the art without departing from the spirit of the disclosure.

In summary, the present invention discloses the memory device, the memory test circuit and the memory test method thereof having repair information maintaining mechanism that accurately store repairing information such that the memory circuit performs repairing accordingly. The condition that false test results are obtained due to the loss of repairing information in the scan test such that the memory circuit is unable to perform repairing in some approaches can be obtained.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A memory test circuit having repair information maintaining mechanism, comprising:
   a memory built-in self repair (MBISR) circuit; and
   a repairing control circuit configured to control the memory built-in self repair circuit to perform a built-in self-repair procedure on a memory circuit having a redundant structure, comprising:
   a remapping storage circuit disposed in a scan chain and configured to receive and store repairing information generated by the memory built-in self repair circuit after the built-in self-repair procedure is finished; and
   a latch storage circuit electrically coupled between the remapping storage circuit and a remapping circuit corresponding to the memory circuit, and configured to receive and store the repairing information from the remapping storage circuit, such that the remapping circuit accesses the repairing information when the remapping storage circuit performs a scan test based on the scan chain to perform remapping and repairing on the memory circuit based on the repairing information and the redundant structure.

2. The memory test circuit of claim 1, wherein the repairing control circuit further comprises a multiplexer having a first input terminal, a second input terminal and an output terminal, the first input terminal being electrically coupled to the memory built-in self repair circuit to receive the repairing information, and the second input terminal and the output terminal being electrically coupled to the remapping storage circuit;

wherein the multiplexer is configured to receive a selection signal such that the first input terminal is selected to receive the repairing information from the memory built-in self repair circuit in a receiving mode and the second input terminal is selected to receive the repairing information stored by the remapping storage circuit in a latch mode.

3. The memory test circuit of claim 1, wherein the latch storage circuit is configured to receive a mode control signal to operate in a transparent mode before the built-in self-repair procedure is finished and operate in a storage mode after the built-in self-repair procedure is finished to receive and store the repairing information from the remapping storage circuit.

4. A memory device, comprising;
a memory circuit having a redundant structure; and
a memory test circuit comprising:
a memory built-in self repair circuit; and
a repairing control circuit configured to control the memory built-in self repair circuit to perform a built-in self-repair procedure on the memory circuit, comprising:
a remapping storage circuit disposed in a scan chain and configured to receive and store repairing information generated by the memory built-in self repair circuit after the built-in self-repair procedure is finished; and
a latch storage circuit electrically coupled between the remapping storage circuit and a remapping circuit corresponding to the memory circuit, and configured to receive and store the repairing information from the remapping storage circuit, such that the remapping circuit accesses the repairing information when the remapping storage circuit performs a scan test based on the scan chain to perform remapping and repairing on the memory circuit based on the repairing information and the redundant structure.

5. The memory device of claim 4, wherein the redundant structure of the memory circuit is at least one redundant row, at least one redundant column or at least one redundant input/output terminal.

6. The memory device of claim 4, wherein the repairing control circuit further comprises a multiplexer having a first input terminal, a second input terminal and an output terminal, the first input terminal being electrically coupled to the memory built-in self repair circuit to receive the repairing information, and the second input terminal and the output terminal being electrically coupled to the remapping storage circuit;

wherein the multiplexer is configured to receive a selection signal such that the first input terminal is selected to receive the repairing information from the memory built-in self repair circuit in a receiving mode and the second input terminal is selected to receive the repairing information stored by the remapping storage circuit in a latch mode.

7. The memory device of claim 4, wherein the latch storage circuit is configured to receive a mode control signal to operate in a transparent mode before the built-in self-repair procedure is finished and operate in a storage mode after the built-in self-repair procedure is finished to receive and store the repairing information from the remapping storage circuit.

8. A memory test method having a repair information maintaining mechanism, comprising:
controlling a memory built-in self repair circuit to perform a built-in self-repair procedure on a memory circuit having a redundant structure by a repairing control circuit;
receiving and storing repairing information generated by the memory built-in self repair circuit by a remapping storage circuit of the repairing control circuit after the built-in self-repair procedure is finished, wherein the remapping storage circuit is disposed in a scan chain;
receiving and storing the repairing information from the remapping storage circuit by a latch storage circuit of the repairing control circuit, wherein the latch storage circuit is electrically coupled between the remapping storage circuit and a remapping circuit corresponding to the memory circuit; and
accessing the repairing information by a remapping circuit of the memory circuit under the control of the latch storage circuit when the remapping storage circuit performs a scan test based on the scan chain to perform remapping and repairing on the memory circuit based on the repairing information and the redundant structure.

9. The memory test method of claim 8, wherein the repairing control circuit further comprises a multiplexer having a first input terminal, a second input terminal and an output terminal, the first input terminal being electrically coupled to the memory built-in self repair circuit to receive the repairing information, and the second input terminal and the output terminal being electrically coupled to the remapping storage circuit, the memory test method further comprises:
receiving a selection signal by the multiplexer such that the first input terminal is selected to receive the repairing information from the memory built-in self repair circuit in a receiving mode and the second input terminal is selected to receive the repairing information stored by the remapping storage circuit in a latch mode.

10. The memory test method of claim 8, further comprising:
receiving a mode control signal by the latch storage circuit to operate in a transparent mode before the built-in self-repair procedure is finished and operate in a storage mode after the built-in self-repair procedure is finished to receive and store the repairing information from the remapping storage circuit.

* * * * *